US010658560B2

(12) United States Patent
Morelli et al.

(10) Patent No.: US 10,658,560 B2
(45) Date of Patent: *May 19, 2020

(54) THERMOELECTRIC MATERIALS BASED ON TETRAHEDRITE STRUCTURE FOR THERMOELECTRIC DEVICES

(71) Applicants: BOARD OF TRUSTEES OF MICHIGAN STATE UNIVERSITY, East Lansing, MI (US); THE REGENTS OF THE UNIVERSITY OF CALIFORNIA, Oakland, CA (US)

(72) Inventors: Donald T. Morelli, White Lake, MI (US); Xu Lu, Lansing, MI (US); Vidvuds Ozolins, Los Angeles, CA (US)

(73) Assignees: Board of Trustees of Michigan State University, East Lansing, MI (US); The Regents of the University of California, Oakland, CA (US)

( * ) Notice: Subject to any disclaimer, the term of this patent is extended or adjusted under 35 U.S.C. 154(b) by 210 days.

This patent is subject to a terminal disclaimer.

(21) Appl. No.: 15/604,011

(22) Filed: May 24, 2017

(65) Prior Publication Data

US 2017/0331023 A1 Nov. 16, 2017

Related U.S. Application Data

(63) Continuation of application No. 14/413,196, filed as application No. PCT/US2013/049350 on Jul. 3, 2013, now Pat. No. 9,673,369.

(Continued)

(51) Int. Cl.
*H01L 35/16* (2006.01)
*C04B 35/626* (2006.01)
(Continued)

(52) U.S. Cl.
CPC ............ *H01L 35/16* (2013.01); *C04B 35/547* (2013.01); *C04B 35/6262* (2013.01);
(Continued)

(58) Field of Classification Search
CPC ............................... H01L 35/16; H01L 35/18
See application file for complete search history.

(56) References Cited

U.S. PATENT DOCUMENTS 3,256,702 A 6/1966 Henderson
4,242,124 A 12/1980 Makipirtti
(Continued)

FOREIGN PATENT DOCUMENTS

CN 101573309 A 11/2009
CN 101993247 A 3/2011
(Continued)

OTHER PUBLICATIONS

Office Action regarding Japanese Patent Application No. 2015-520687, dated Apr. 4, 2017. Translation provided by Harakenzo World Patent and Trademark.
(Continued)

*Primary Examiner* — C Melissa Koslow
(74) *Attorney, Agent, or Firm* — Harness, Dickey & Pierce, PLC

(57) ABSTRACT

Thermoelectric materials based on tetrahedrite structures for thermoelectric devices and methods for producing thermoelectric materials and devices are disclosed.

8 Claims, 18 Drawing Sheets

Related U.S. Application Data

(60) Provisional application No. 61/668,766, filed on Jul. 6, 2012.

(51) Int. Cl.
    *C04B 35/645* (2006.01)
    *C04B 35/547* (2006.01)
    *H01L 35/18* (2006.01)

(52) U.S. Cl.
    CPC ...... *C04B 35/62645* (2013.01); *C04B 35/645* (2013.01); *H01L 35/18* (2013.01); *C04B 2235/3262* (2013.01); *C04B 2235/3272* (2013.01); *C04B 2235/3281* (2013.01); *C04B 2235/3284* (2013.01); *C04B 2235/3291* (2013.01); *C04B 2235/3294* (2013.01); *C04B 2235/6562* (2013.01); *C04B 2235/6565* (2013.01); *C04B 2235/6567* (2013.01); *C04B 2235/662* (2013.01); *C04B 2235/77* (2013.01); *C04B 2235/80* (2013.01); *C04B 2235/81* (2013.01)

(56) References Cited

U.S. PATENT DOCUMENTS

| | | |
|---|---|---|
| 9,673,369 B2* | 6/2017 | Morelli .......... C04B 35/547 |
| 2003/0056819 A1 | 3/2003 | Imai et al. |
| 2011/0108778 A1 | 5/2011 | Ren et al. |
| 2012/0111385 A1 | 5/2012 | Ramanath et al. |
| 2015/0011042 A1 | 1/2015 | Kimball et al. |
| 2015/0200345 A1 | 7/2015 | Morelli et al. |
| 2016/0141481 A1 | 5/2016 | Morelli et al. |
| 2018/0233646 A1 | 8/2018 | Morelli et al. |

FOREIGN PATENT DOCUMENTS

| | | |
|---|---|---|
| JP | S54096402 A | 7/1979 |
| JP | 2004179264 A | 6/2004 |
| JP | 2006019355 A | 1/2006 |
| JP | 2006269731 A | 10/2006 |
| JP | 2007116156 A | 5/2007 |
| WO | WO-2014168963 A1 | 10/2014 |

OTHER PUBLICATIONS

European Patent Application No. 13740424.0 Communication Purusant to Article 94(3) EPC, dated Jan. 30, 2017.
Japanese Application No. 2015-520687 Office Action dated Dec. 20, 2016. Translation provided by Harakenzo World Patent and Trademark.
European Application No. 14820390.4 Communication Pursuant to Rules 70(2) and 70a(2) EPC, dated Nov. 17, 2016.
Chinese Application No. 2013800360335; Office Action dated Jan. 15, 2016 Translation provided by Dragon Intellectual Porop U.S. Pat. No. 3,256,702—Aerty Law.
Chinese Application No. 2013800360335; Office Action dated Sep. 6, 2016 Translation provided by Dragon Intellectual Poroperty Law.
Kiyoaki Tatsuka et al.: Tetrahedrite stability relations in the Cu—Fe—Sb—S system; American Mineralogist, vol. 62, pp. 1101-1109, 1977.
International Preliminary Report on Patentability for PCT/US2014/045458, dated Jan. 5, 2016.
International Search Report and Written Opinion for PCT/US2014/045458, dated Nov. 3, 2014, ISA/EP.
International Preliminary Report on Patentability for PCT/US2013/049350, dated Jan. 6, 2015.
Suekuni, Koichiro, et al.: "Thermoelectric Properties of Mineral Tetrahedrites Cu10Tr2Sb4S13 with Low Thermal Conductivity", Applied Physics Express, The Japan Society of Applied Physics, vol. 5, No. 5, May 1, 2012 (May 1, 2012), pp. 51201-1, XP001576490, ISSN: 1882-0778, DOI: 10.1143/APEX.5.051201 [retrieved on May 10, 2012].
Lu, Xu, et al.: "High Performance Thermoelectricity in Earth-Abundant Compounds Based on Natural Mineral Tetrahedrites", Advanced Energy Materials, vol. 3, Oct. 18, 2012 (Oct. 18, 2012), pp. 342-348, XP002712392.
Lu, Xu, et al.: "Natural mineral tetrahedrite as a direct source of thermoelectric materials", Physical Chemistry Chemical Physics, vol. 15, No. 16, Mar. 14, 2013 (Mar. 14, 2013), p. 5762, XP0055077893, ISSN: 1463-9076, DOI: 10.1039/c3cp50920f.
Suekuni, Koichiro, et al.: "High-performance thermoelectric mineral CuNiSbStetrahedrite", Journal of Applied Physics, American Institute of Physics, New York, US, vol. 113, No. 4, Jan. 28, 2013 (Jan. 28, 2013), pp. 43712-43712, XP012169695, ISSN: 0021-8979, DOI: 10.1063/1.4789389 [retrieved on Jan. 28, 2013].
International Search Report and Written Opinion for PCT/US2013/049350, dated Sep. 9, 2013, ISA/EP.
Supplementary European Search Report for EP 14820390, dated Oct. 17, 2016.
Extended European Search Report for EP 148200390.4, dated Oct. 31, 2016.
An, Changhua et al., "Selective synthesis and characterization of famatinite nanofibers and tetrahedrite nanoflakes." Journal of Materials Chemistry, vol. 13, No. 2, pp. 301-303 (2003).
Biswas, Kanishka et al., "High-performance bulk thermoelectrics with all-scale hierarchical architectures." Nature, vol. 489, pp. 414-418 (2012).
Lu, Xu et al., "Rapid synthesis of high-performance thermoelectric materials directly from natural mineral tetrahedrite." MRS Communications, vol. 3, No. 3, pp. 129-133 (2013).
Suekuni, Koichiro et al., "Systematic study of electronic and magnetic properties for $Cu_{12-x}TM_xSb_4S_{13}$ (TM = Mn, Fe, Co, Ni, and Zn) tetrahedrite." Journal of Applied Physics, vol. 115, No. 14, pp. 143702-1-143702-5 (2014).
Telkes, Maria, "Thermoelectric power and electrical resistivity of minerals." American Mineralogist, vol. 35, No. 7-8, 1950, pp. 536-555.
Office Action regarding Australian Patent Application No. 2013286602, dated Dec. 21, 2015.
International Search Report and Written Opinion of the International Searching Authority regarding International Application No. PCT/US2015/0066796, dated Oct. 13, 2016.
Office Action regarding European Patent Application No. 14820390.4, dated Oct. 16, 2017.
Office Action regarding Japanese Patent Application No. 2016-524830, dated Dec. 19, 2017. Translation provided by Harakenzo World Patent and Trademark.
Office Action regarding European Patent Application No. 13740424.0, dated Jan. 3, 2018.
International Preliminary Report on Patentability regarding International Application No. PCT/US2015/066796, dated Feb. 6, 2018.
Office Action regarding European Patent Application No. 14820390.4, dated May 16, 2018.
Office Action regarding Japanese Patent Application No. 2016-524830, dated Oct. 23, 2018. Partial translation provided by Harakenzo World Patent and Trademark.
Office Action regarding European Patent Application No. 14820390.4, dated Dec. 4, 2018.
Office Action regarding European Patent Application No. 13740424.0, dated Dec. 13, 2018.
Office Action regarding Canadian Patent Application No. 2,878,448, dated May 7, 2019.

* cited by examiner

Figure 8

THERMOELECTRIC MATERIALS BASED ON TETRAHEDRITE STRUCTURE FOR THERMOELECTRIC DEVICES

CROSS-REFERENCE TO RELATED APPLICATIONS

This application is a continuation of U.S. patent application Ser. No. 14/413,196, filed Jan. 6, 2015 (now U.S. Pat. No. 9,673,369); which is a National Stage Entry of PCT/US2013/049350, filed Jul. 3, 2013; which claims the benefit of U.S. Provisional Application No. 61/668,766, filed Jul. 6, 2012. The entire disclosures of each of the above applications are incorporated herein by reference.

GOVERNMENT RIGHTS

This invention was made with government support under DE-SC0001054 awarded by the U.S. Department of Energy. The government has certain rights in the invention.

FIELD

The present disclosure relates to thermoelectric materials based on tetrahedrite structure for thermoelectric devices and, more particularly, to the manufacturing and uses for tetrahedrite like thermoelectric materials.

BACKGROUND AND SUMMARY

This section provides background information related to the present disclosure which is not necessarily prior art. Thermoelectric materials may be used for direct conversion of heat to electricity and, thus, can substantially increase the efficiency of energetic processes. Current state of the art thermoelectric materials are comprised of elements which are in low abundance and often toxic.

In the past few decades, thermoelectric (TE) materials have been a focus topic in solid-state physics and materials science due to their potential application in waste energy harvesting or Peltier cooling. The efficiency of thermoelectric materials is evaluated by the figure of merit ($ZT=S^2\sigma T/\kappa$), where S is the Seebeck coefficient, $\sigma$ the electric conductivity, T the absolute temperature, and $\kappa$ thermal conductivity. For many years, the benchmark for a good thermoelectric material has been ZT of order unity, typified by $Bi_2Te_3$ and its alloys which are used commercially in thermoelectric cooling modules.

One very successful route to improving ZT in bulk solids is reduction of lattice thermal conductivity. For instance, the notion of "phonon glass/electron crystal (PGEC)" was introduced to describe materials which exhibit lattice thermal conductivity like a glassy or amorphous solid, and electronic properties of a good crystal. For amorphous or glassy solids, the phonon mean free path approaches one interatomic spacing; a phonon mean free path shorter than one interatomic spacing loses its meaning, and thus this type of thermal transport has been termed "minimal" thermal conductivity. Unfortunately, poor electrical conductivity in such amorphous solids prevents them from exhibiting high values of figure of merit. More interesting from the thermoelectric point of view are crystalline solids which exhibit minimal thermal conductivity, due to strong intrinsic phonon scattering. Examples here include, in addition to the afore-mentioned skutterudites, complex cage structures such as clathrates. Recently, minimal thermal conductivity was discovered in crystalline rocksalt structure I-V-$VI_2$ compounds (e.g., $AgSbTe_2$), semiconductors typified by the lattice thermal conductivity of a glassy or amorphous system. These materials exhibit electronic properties characteristic of good crystals and thus have demonstrated good thermoelectric behavior.

Recently, Skoug and Morelli identified a correlation between minimal thermal conductivity and the existence of a Sb lone pair in Sb-containing ternary semiconductors. Lone pair electrons induce large lattice anharmonicity that gives rise to thermal resistance. Using density functional theory calculations, it has been demonstrated explicitly the occurrence of large Grüneisen parameter in $Cu_3SbSe_3$ compounds and, using these parameters to calculate phonon scattering rates, were able to quantitatively account for the thermal conductivity using the Debye-Callaway formalism.

Over the last 15 years, with a more complete understanding of electronic and thermal transport in semiconductors, better control over synthesis methods, and the successful application of nanotechnology, new materials systems with ZT values higher than unity have been discovered and developed, including thin film superlattices, filled skutterudites, and bulk nanostructured chalcogenides. Unfortunately, many of these new materials are not suitable for large scale application because of complex and costly synthesis procedures, or the use of rare or toxic elements. A current challenge is the discovery of new thermoelectric materials which are inexpensive, environmental-friendly, easy to synthesize, and comprised of earth-abundant elements.

The chemical compositions described herein are synthesized from earth abundant materials and in some cases can be extracted in nearly ready-to-use form from the earth's crust. Furthermore, the compounds are comprised of elements of low atomic mass, such that the density of the compounds is significantly less than state of the art compounds. These compounds can be used in provide, lightweight, low-cost thermoelectric devices for large scale conversion of heat to electricity.

According to the present teaching, a thermoelectric device having a pair of conductors and a layer of tetrahedrite disposed between the pair of conductors. The thermoelectric material can be $Cu_{12-x}M_xSb_4S_{13}$.

According to another teaching, a thermoelectric device is provided having a pair of conductors and a layer of tetrahedrite disposed between the pair of conductors. The tetrahedrite comprises $Cu_{12-x}M_xSb_{4-y}As_yS_{13}$ where M is selected from the group consisting of Ag, Zn, Fe, Mn, Hg and combinations thereof; $0 < x < 2$; and $0 \le y < 4$.

According to another teaching a thermoelectric material is presented formed of sintered tetrahedrite having $Cu_{12-x}M_xSb_{4-y}As_yS_{13}$. M is selected from the group of Zn at a concentration $0 < x < 2.0$, Fe at a concentration $0 < x < 1.5$, and combinations thereof, and $0 \le y < 4$.

According to another teaching, a thermoelectric device is provided having a pair of conductors, and $Cu_{12-x}M_xSb_4S_{13}$ disposed between the conductors, where M is one of Zn and Fe.

According to another teaching, a thermoelectric device is provided having a pair of conductors. A p-type thermoelectric material disposed between the conductors, the thermoelectric material being formed of a sintered tetrahedrite powder.

According to another teaching, method of producing a thermoelectric device is disclosed. The Method includes forming tetrahedrite comprising $Cu_{12-x}M_xSb_4S_{13}$ where M is selected from the group of Zn at a concentration $0 < x < 2.0$, Fe at a concentration $0 < x < 1.5$, and combinations thereof. The tetrahedrite is ground and hot pressed to form a pellet. The pellet is disposed between a pair of electrical conductors.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure.

FIG. 2b represents the Seebeck coefficient of tetrahedrite of composition $Cu_{12-x}Zn_xSb_4S_{13}$; sample designation as in FIG. 2a;

Figures 3A, 3B:
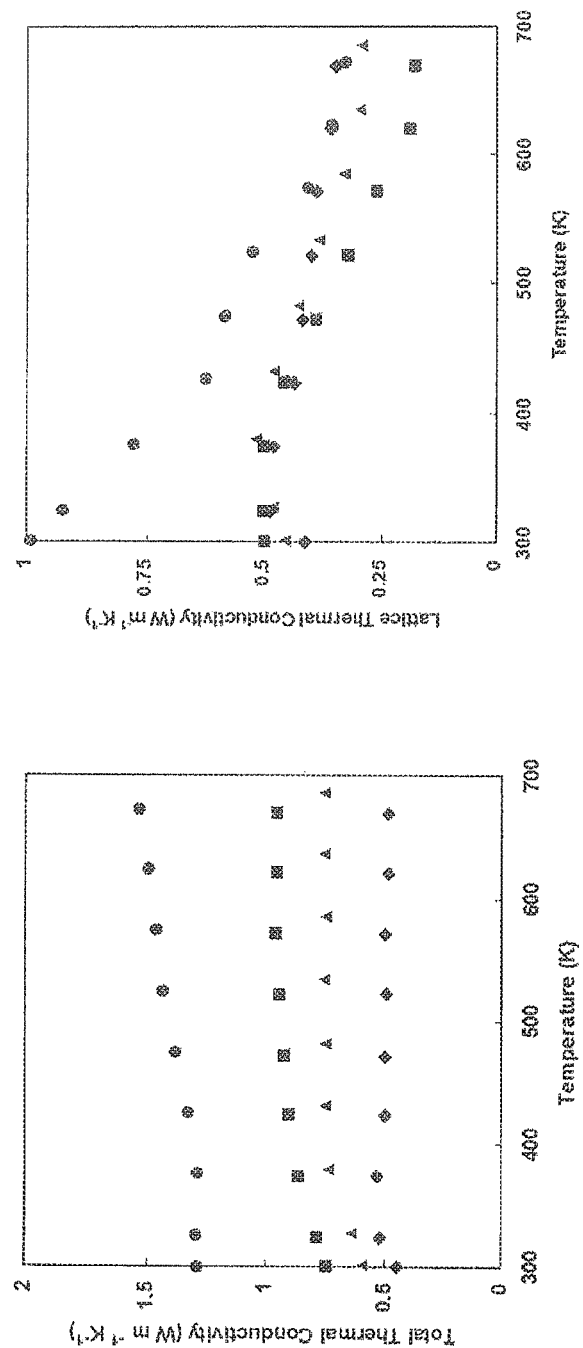
Figure 4B:
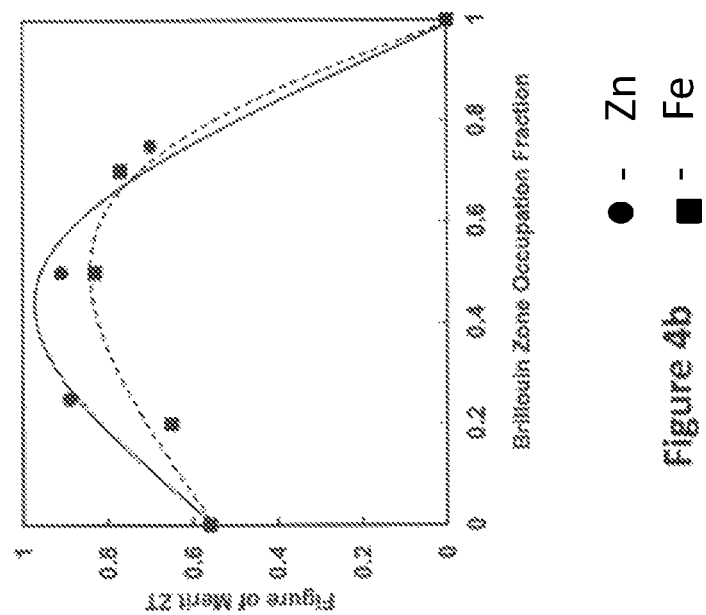
Figure 4A:
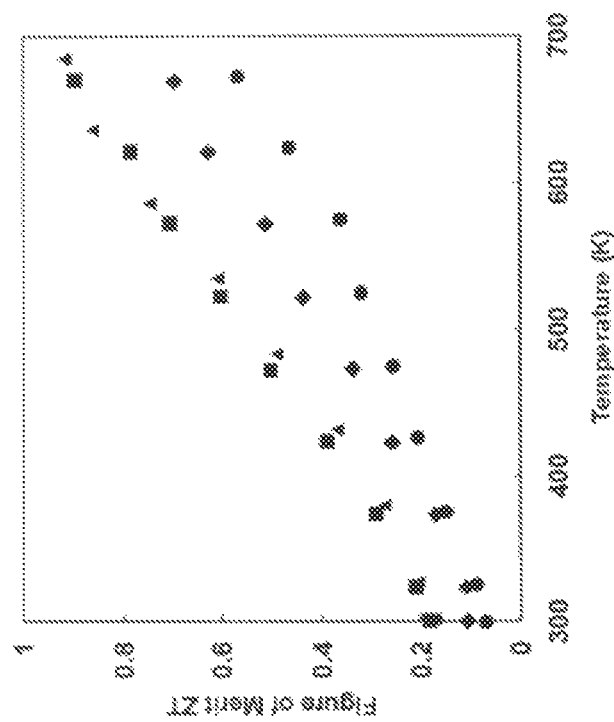
Figure 5B:
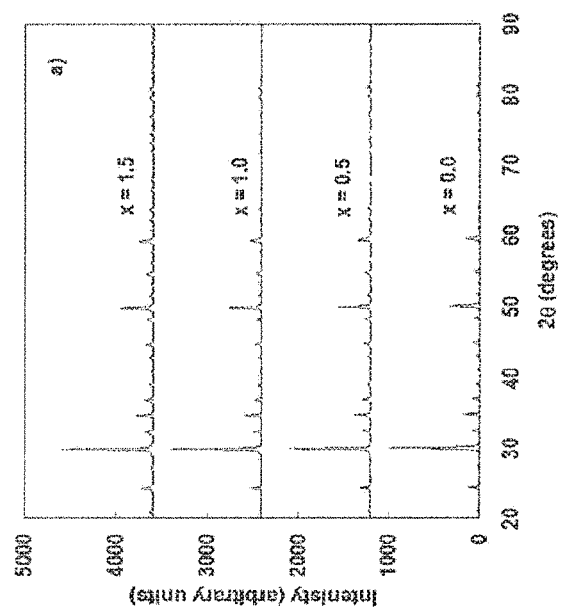
Figure 5A:
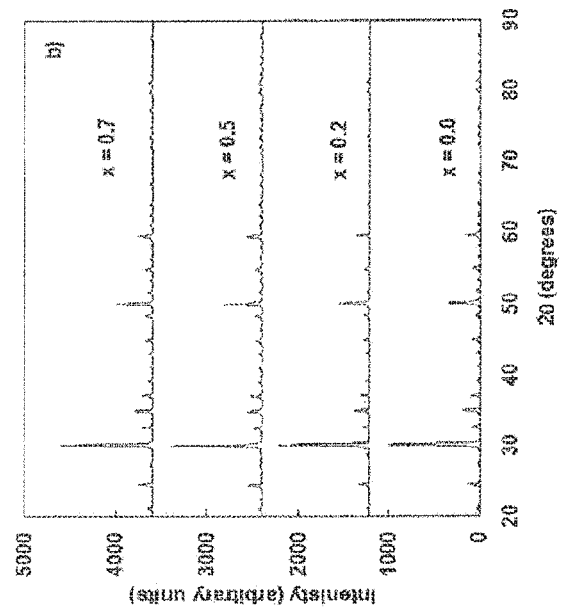
Figures 6A, 6B:
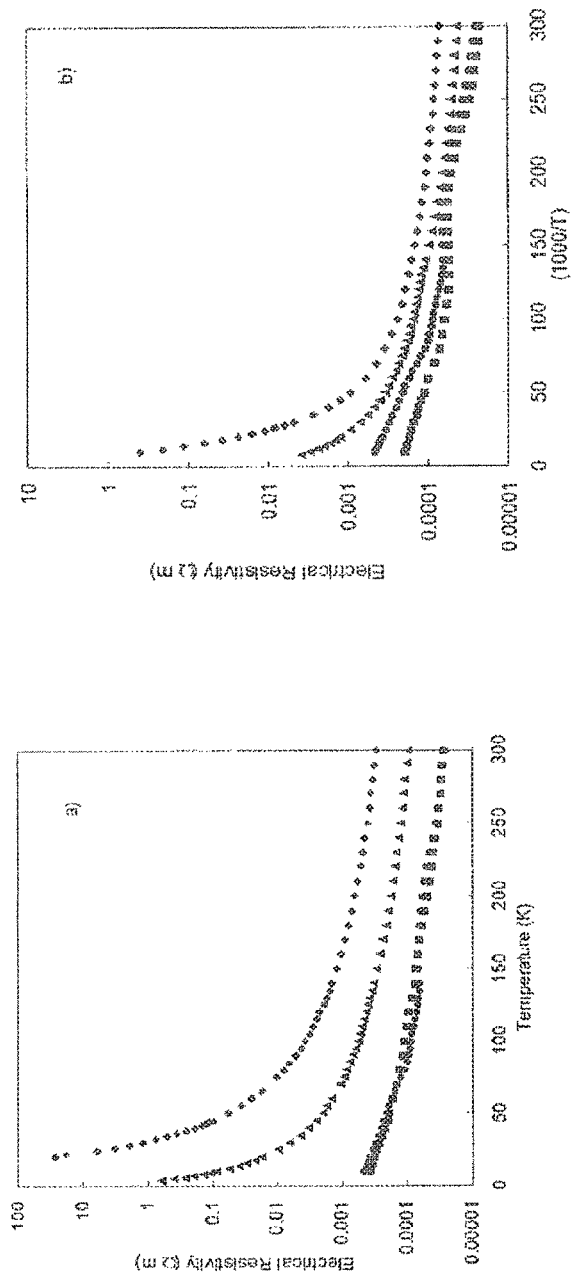
Figure 6C:
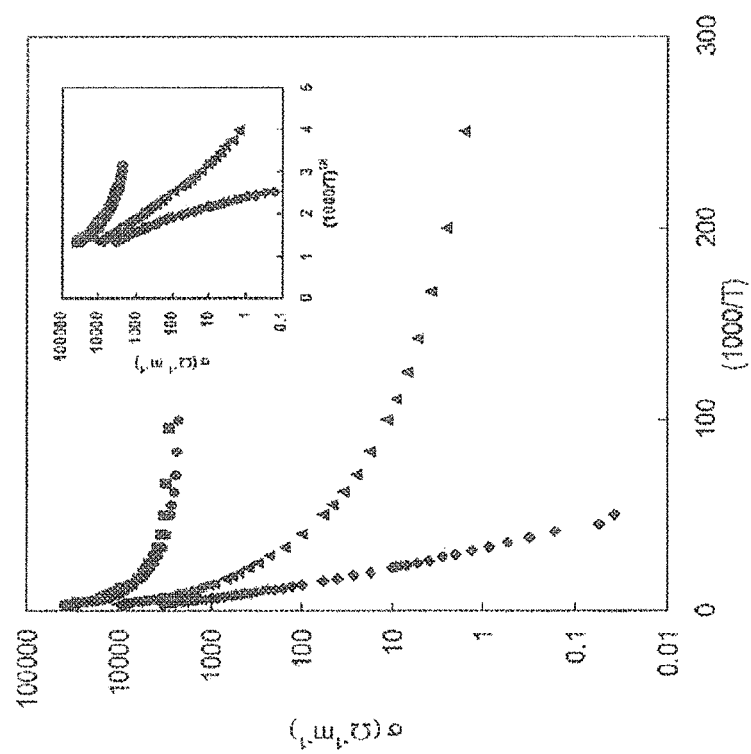
Figure 7:
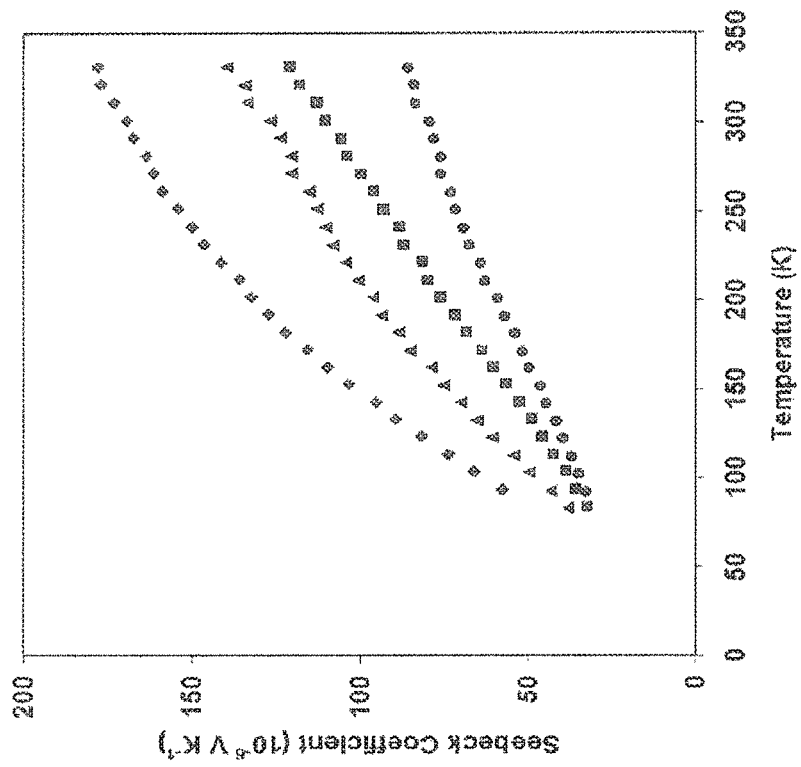
Figure 9:
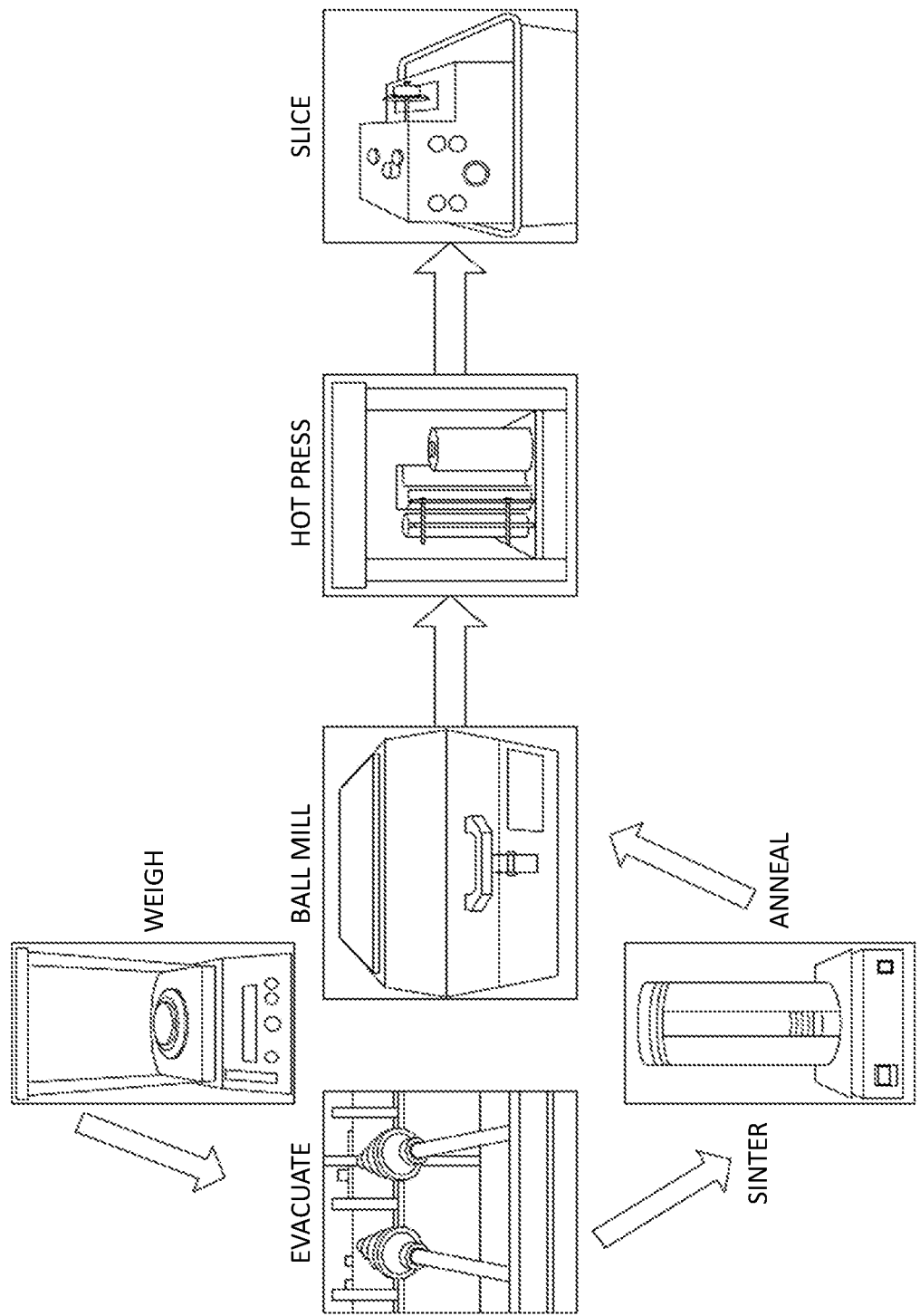
Figure 10:
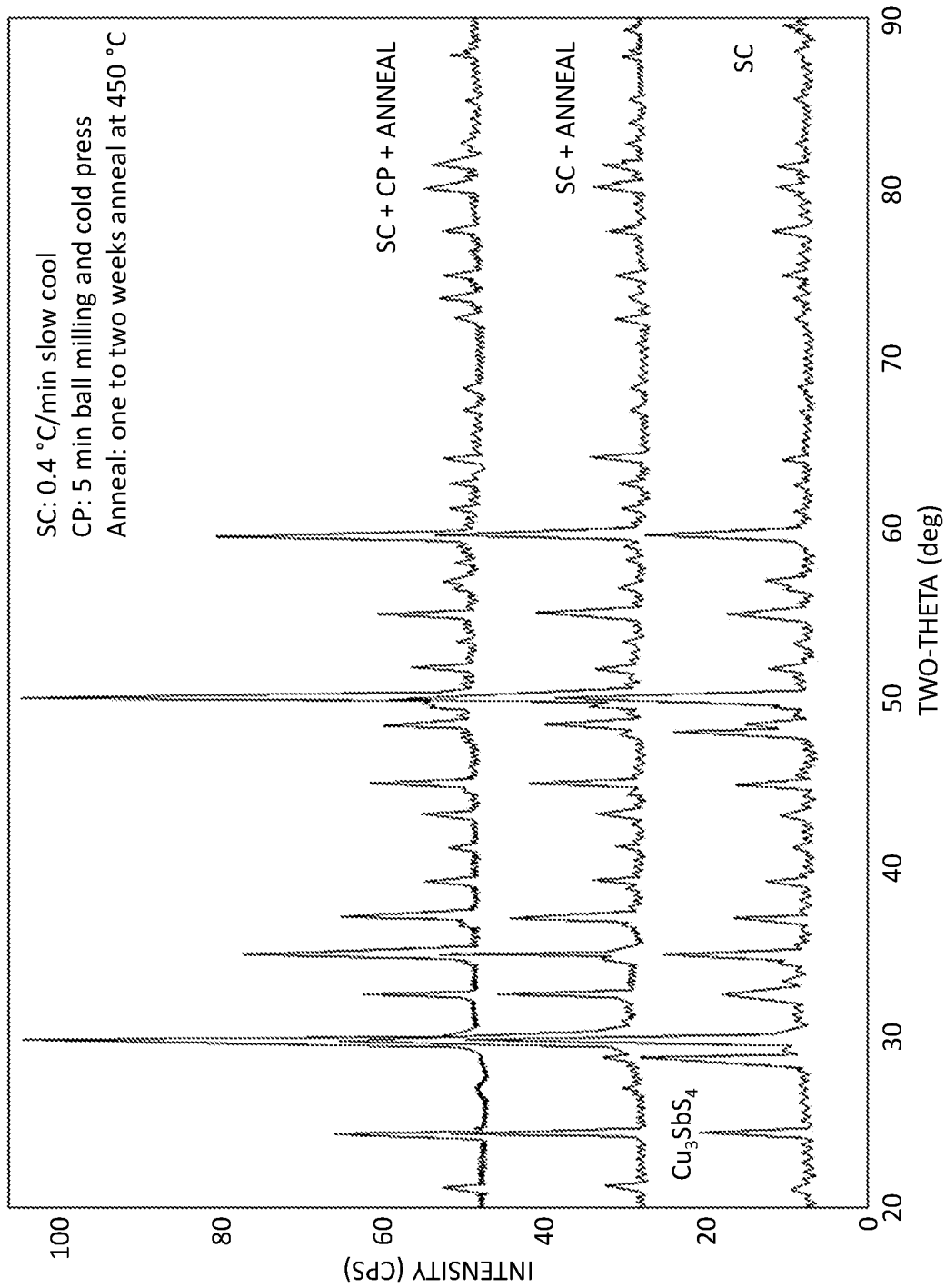
Figure 11:
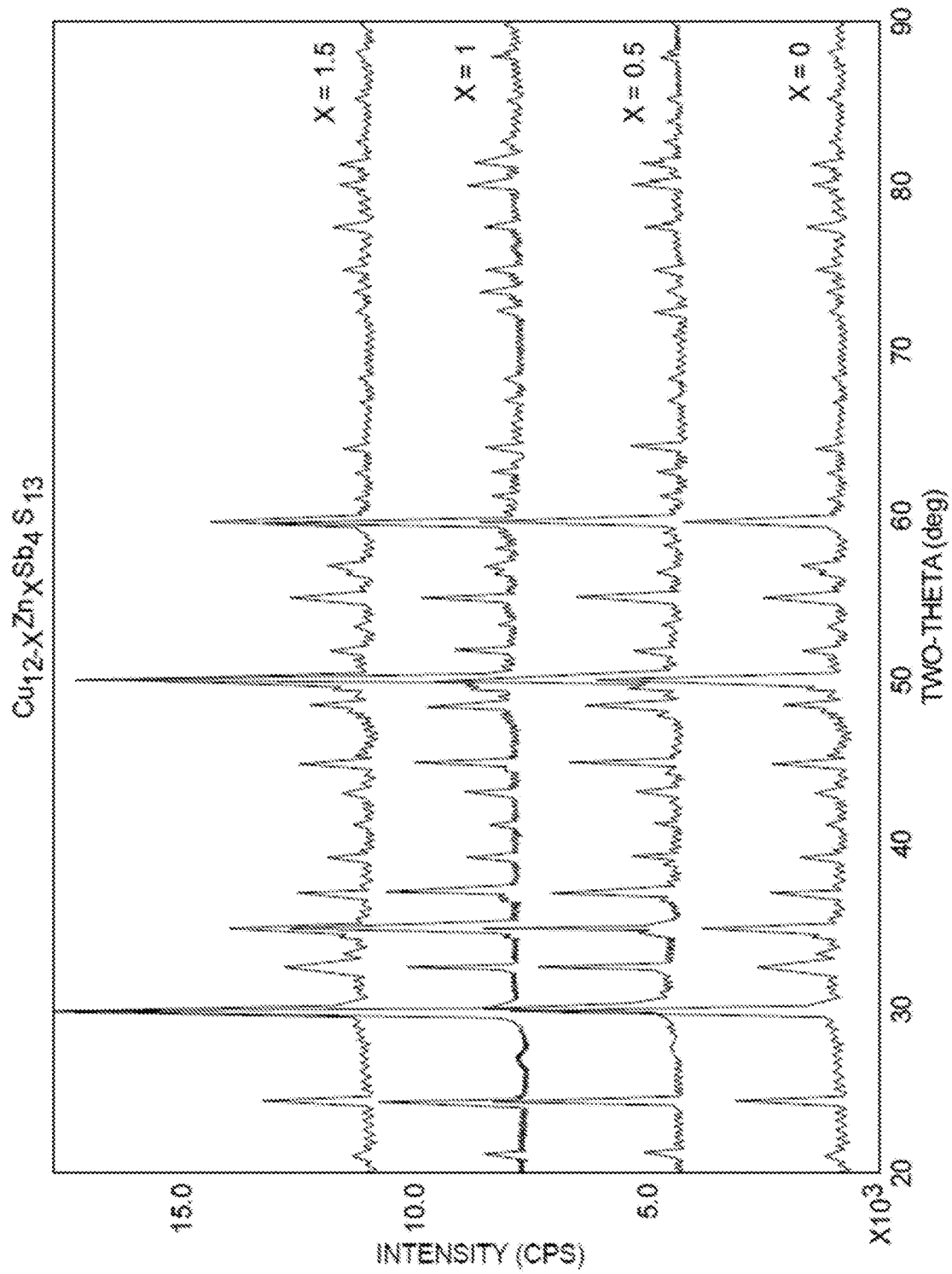
Figure 12:
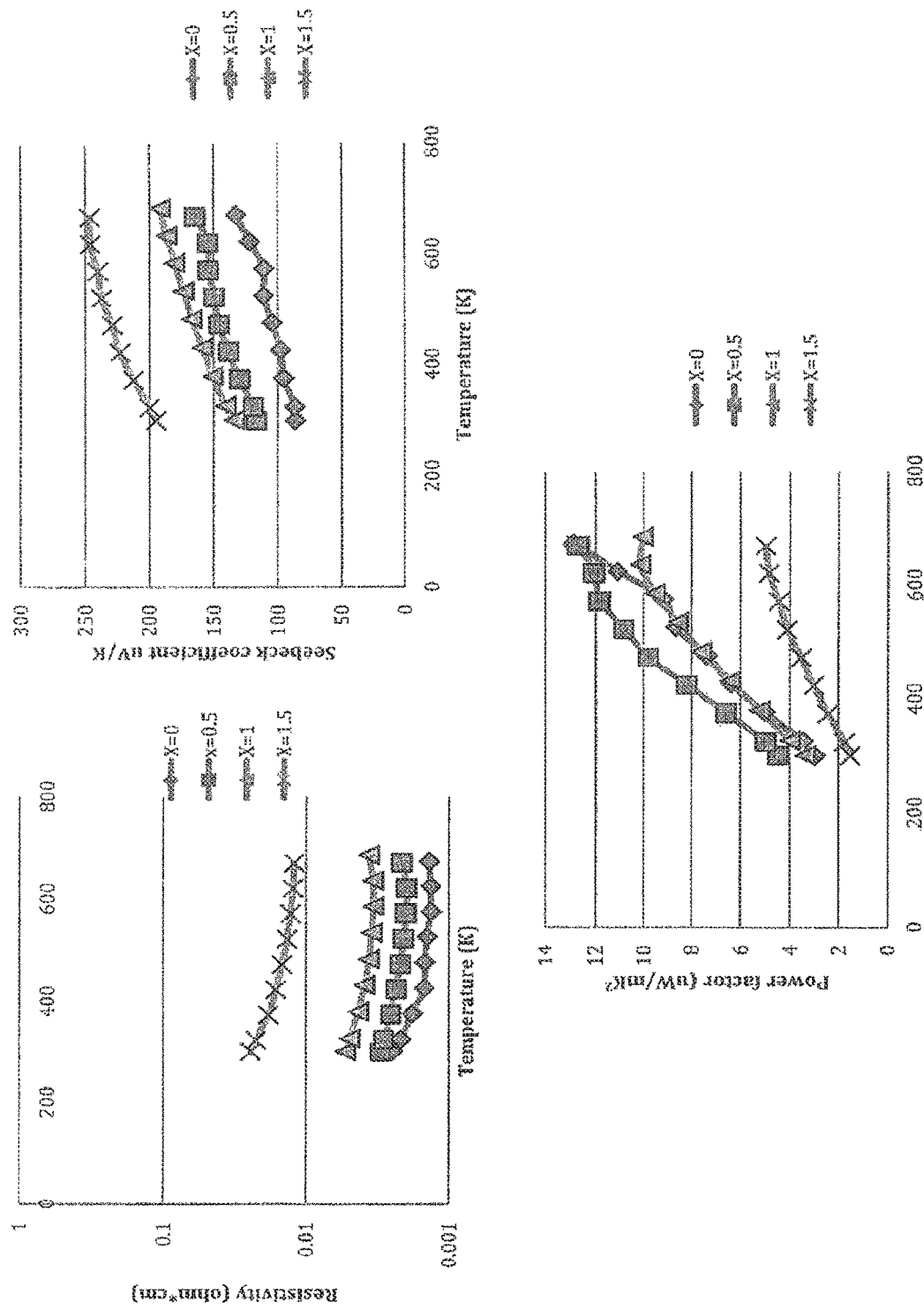
Figure 13:
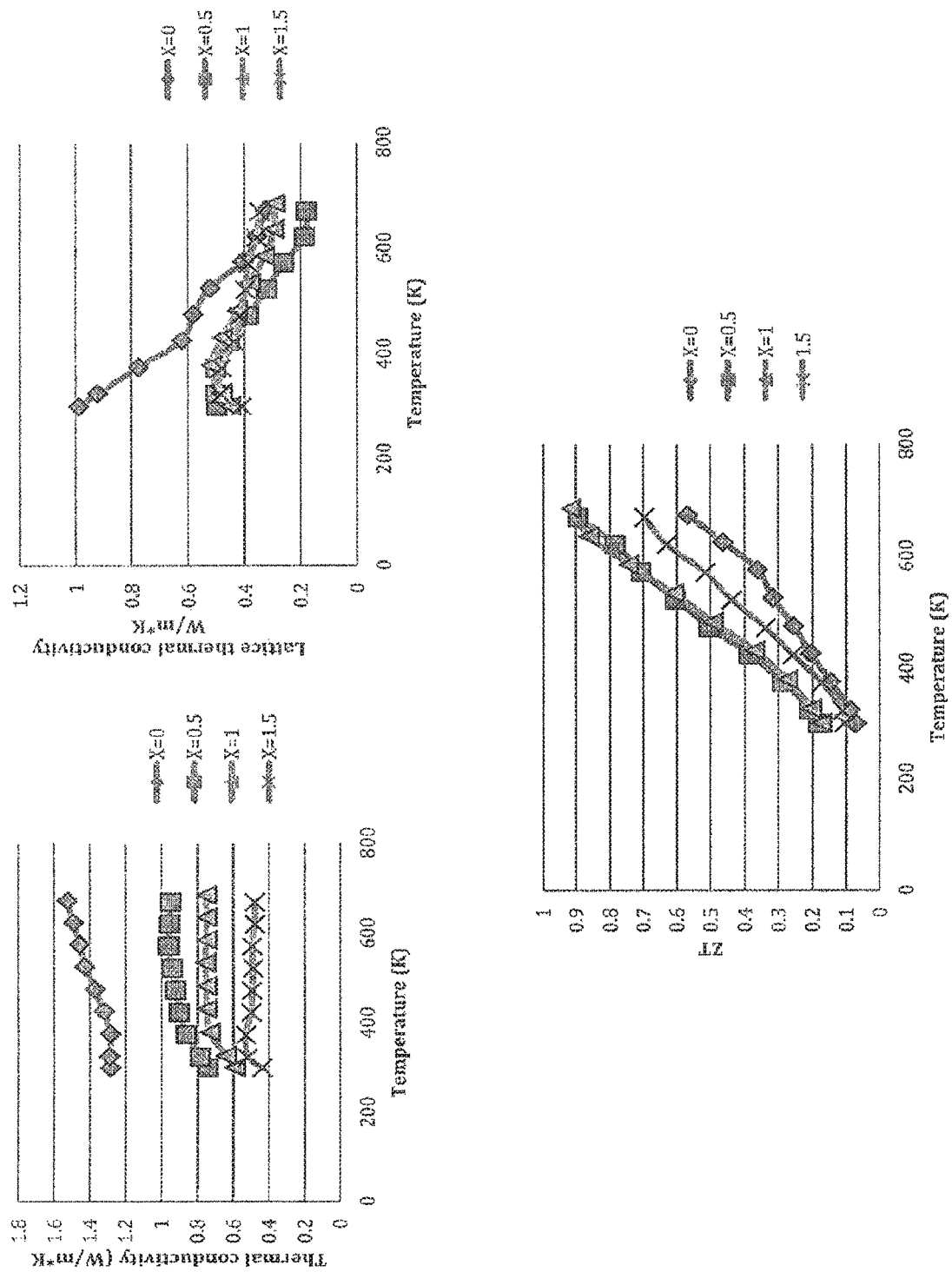
Figure 14:
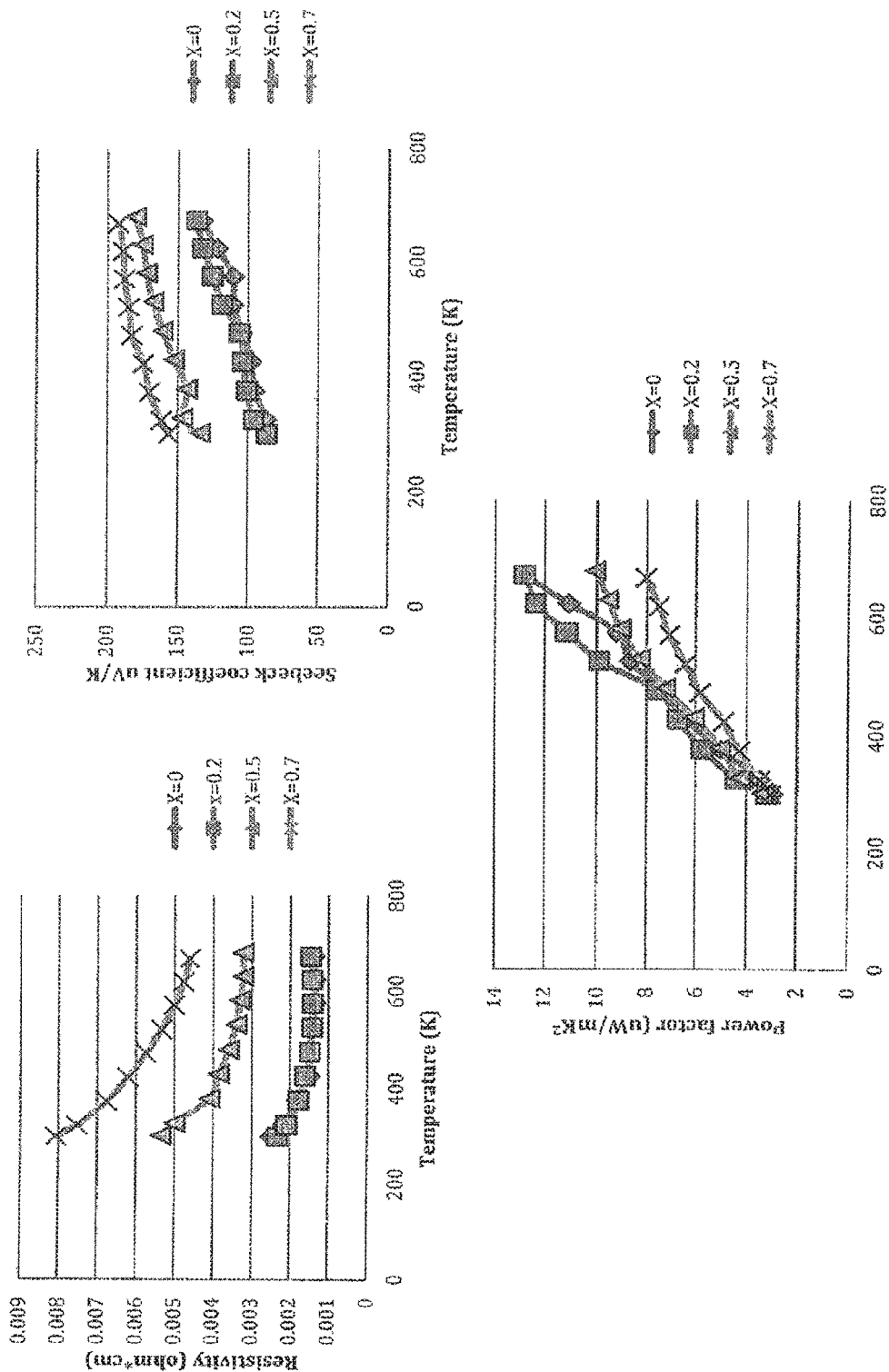
Figure 15:
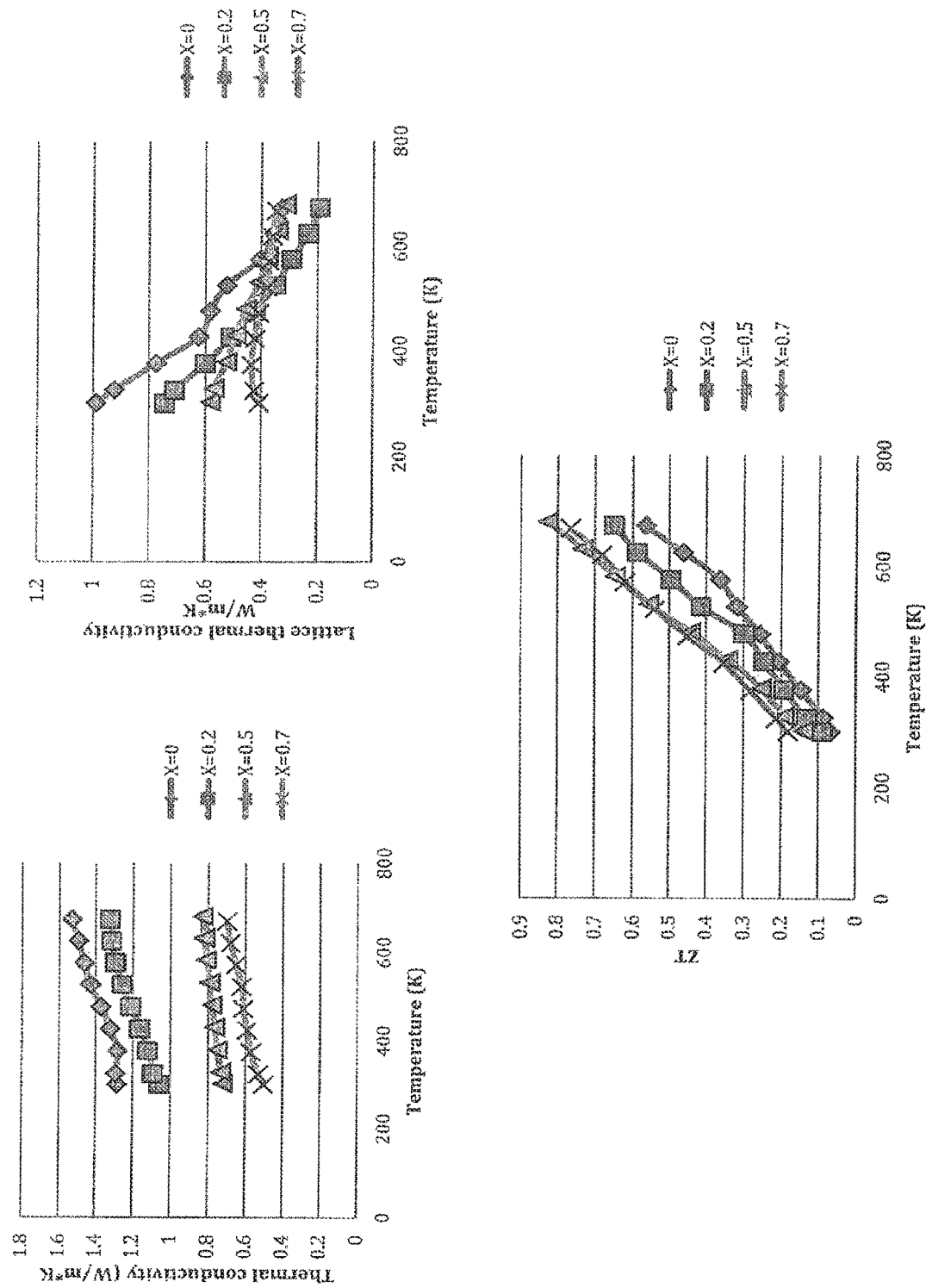
Figure 16:
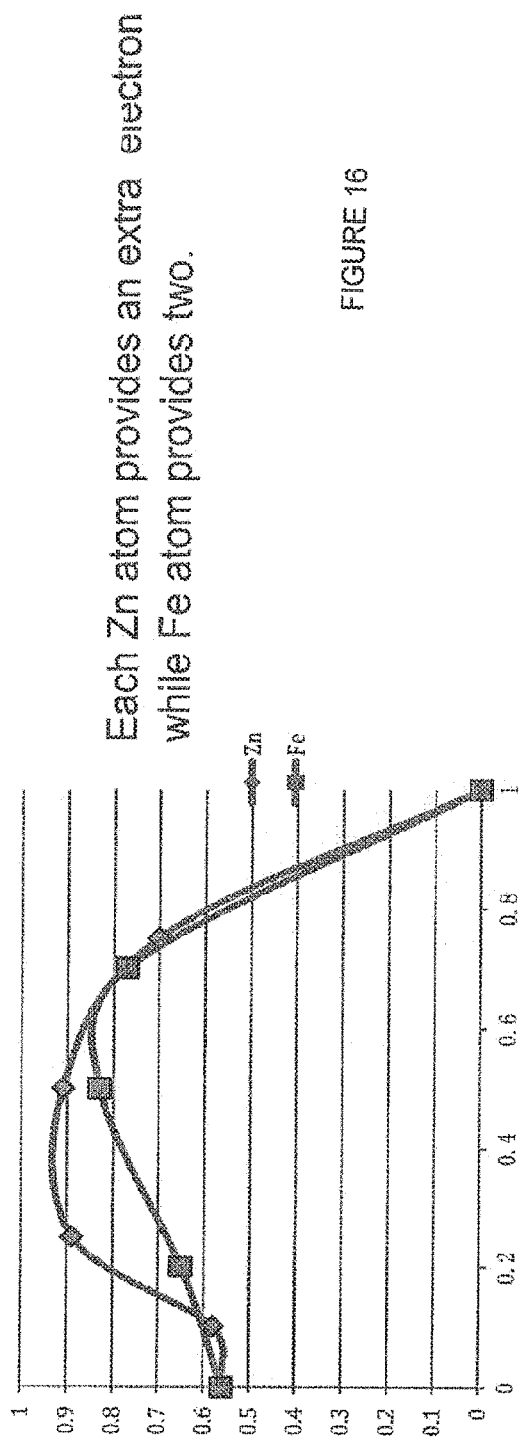

FIG. 3a total lattice thermal conductivities of $Cu_{12-x}Zn_xSb_4S_{13}$, where circles represent x=0, squares represent x=0.5, triangles represent x=1, and diamonds represent x=1.5;

FIG. 3b represents lattice thermal conductivities of $Cu_{12-x}Zn_xSb_4S_{13}$, where circles represent x=0, squares represent x=0.5, triangles represent x=1, and diamonds represent x=1.5;

FIG. 4a represents the dimensionless thermoelectric figure of merit ZT as a function of temperature for tetrahedrite $Cu_{12-x}Zn_xSb_4S_{13}$, where circles represent x=0, squares represent x=0.5, triangles represent x=1, and diamonds represent x=1.5;

FIG. 4b represents a figure of merit versus Brillouin zone occupation number for $Cu_{12-x}M_xSb_4S_{13}$ (M=Zn, Fe);

FIGS. 5a and 5b represent X-ray diffraction patterns for a) $Cu_{12-x}Zn_{2-x}Sb_4S_{13}$ and b) $Cu_{12-x}Fe_{2-x}Sb_4S_{13}$ samples;

FIGS. 6a and 6b represent a) thermal diffusivity and b) specific heat capacity for synthetic tetrahedrite specimens;

FIG. 6c represents conductivity vs. $T^{-1}$ for the synthetic species;

FIG. 7 represents low temperature electrical conductivity versus inverse temperature for $Cu_{12-x}Zn_{2-x}Sb_4S_{13}$;

Figure 8:
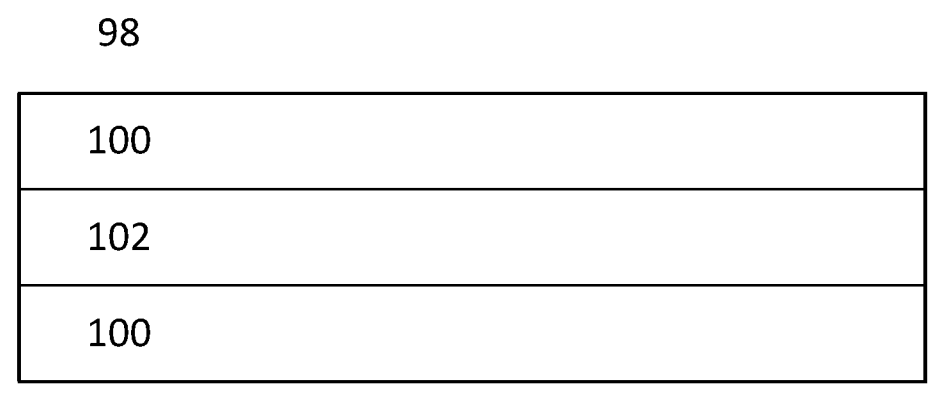

FIG. 8 represents a thermo-electric device according to the present teachings;

FIG. 9 represents the method of producing the materials according to the present teachings;

FIGS. 10 and 11 represent TEM plots for materials at varying stages of manufacture;

FIGS. 12-13 represent various material properties for $Cu_{12-x}Zn_xSb_4S_{13}$ where x is 0, 0.5, 1, and 1.5;

FIGS. 14-15 represent various material properties for $Cu_{12-x}Fe_xSb_4S_{13}$, where x is 0, 0.2, 0.5, and 0.7; and FIG. 16 shows a Brillouin zone model for tetrahedrite $Cu_{12-x}M_xSb_{4.09}S_{13}$, $Cu_{12-x}M_xSb_4S_{13}$, where M is Fe or Zn and x is 2, or $Cu_{12-x}M_xSb_4S_{13}$, where M is Fe or Zn and has a Brillouin zone occupation fraction of 0-1.

Corresponding reference numerals indicate corresponding parts throughout the several views of the drawings.

DETAILED DESCRIPTION

Example embodiments will now be described more fully with reference to the accompanying drawings. Thermoelectric materials can convert waste heat into electricity, potentially improving the efficiency of energy usage in both industry and everyday life. Unfortunately, known good thermoelectric materials often are comprised of elements that are in low abundance and/or toxic, and frequently require careful doping and complex synthesis procedures. Here, high thermoelectric figure of merit in compounds of the form $Cu_{12-x}TM_xSb_4S_{13}$, where TM is a transition metal, such as Zn or Fe, and 0<x<2. In these compounds the dimensionless figure of merit reaches 0.9 around 673K, comparable to that of other state of art p-type thermoelectric materials in the same temperature range. Importantly, the figure of merit remains high for a wide range of values of x. The subject compositions are among those that form the class of natural minerals known as tetrahedrites. Thermoelectrics comprised of earth-abundant elements will pave the way to many new, low cost thermoelectric energy generation opportunities.

Described below in detail is the synthesis and measurement of the thermoelectric properties of tetrahedrite-based compounds. Generally, pure $Cu_{12}Sb_4S_{13}$ exhibits a ZT value of 0.56 at 673K (400° C.). This pure 12-4-13 composition does not occur in natural minerals. Rather, natural tetrahedrite is of typical composition $Cu_{12-x}M_xSb_4S_{13}$ and is a very commonly occurring sulfosalt, found quite typically with M=Zn and Fe. The most common substitution elements are Zn and Fe on Cu sites, up to 15% in the natural mineral ZT values of up to 0.91 near 673 K in $Cu_{12-x}(Zn,Fe)_xSb_4S_{13}$ with x=0-1.5 and x=0-0.7 for Zn and Fe, respectively have been measure. This result highlights the potential of directly using natural tetrahedrite minerals as source thermoelectric materials, without the need for time and energy consuming synthetic procedures or precise doping.

Figure 1:
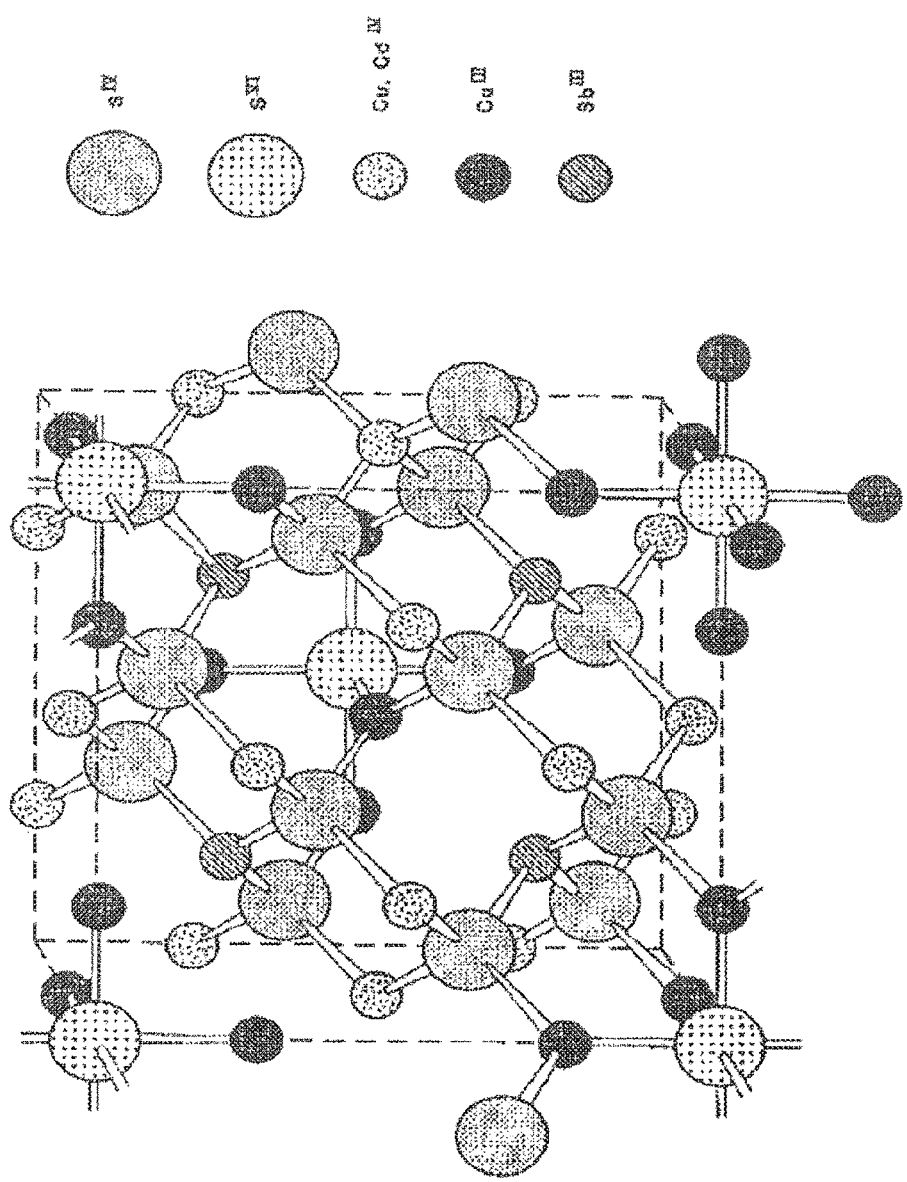
FIG. 1 represents a tetrahedrite structure according to the present teachings.
Figure 2A:
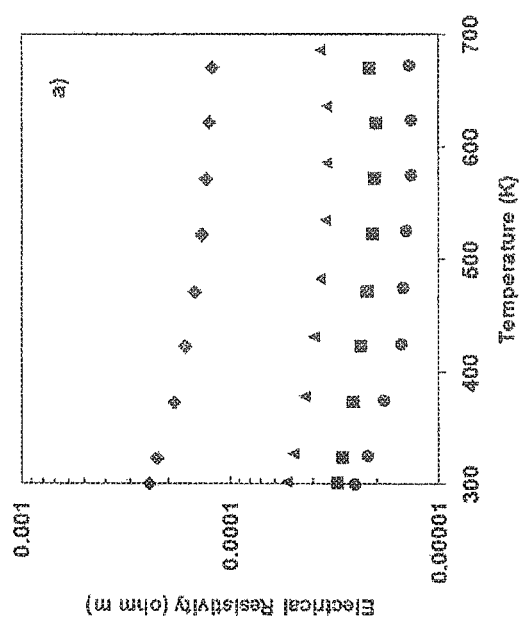
FIG. 2a represents an electrical resistivity of synthetic tetrahedrite of composition $Cu_{12-x}Zn_xSb_4S_{13}$ above room temperature.

Pure $Cu_{12}Sb_4S_{13}$ and compounds with substitution of Fe and Zn on the Cu site were synthesized using a vacuum, annealing, and hot-pressing procedure. The samples are single phase and at a density of ≥95%, and preferably ≥98% theoretical density. FIG. 2a shows the electrical resistivity of $Cu_{12-x}Zn_xSb_4S_{13}$ in the temperature range 373 K 673 K with x ranging from 0 to 1.5, with circles representing x=0; squares representing x=0.5, triangles representing x=1, and diamonds representing x=1.5. FIGS. 2a-4b share these indicators. The low temperature resistivity shows semiconductor-like characteristics but it cannot be fit with a simple activated behavior; rather, the conductivity behavior is more consistent with a hopping-type mechanism. Attempts to measure hole concentration using the Hall effect proved unsuccessful; even in large field a Hall coefficient $R_H$ close to zero is measured. In terms of the crystal-chemical argument given above, this would imply that at least some of the nominally divalent Cu ions are in a monovalent or mixed valent state, giving rise to a partially filled Brillouin zone and metallic behavior.

The band structure calculations show that $Cu_{12}Sb_4S_{13}$ is a metal. In pure and lightly Zn-substituted samples (x=0, 0.5 and 1), resistivities are on the order of $10^{-3}$ ohm cm, which are comparable to other good thermoelectric materials. When the Zn content is increased to x=1.5, the resistivity increases by one order compared to the pure sample, and found that for a Zn-substituted sample with x=2.0 the material is electrically insulating. Since it is expected that the Zn ion will be strictly in the $Zn^{2+}$ state, this is consistent with the replacement of all nominal $Cu^{2+}$ ions with $Zn^{2+}$ ions, complete filling of the Brillouin zone, and the occurrence of a true semiconducting state.

As the Zn concentration is increased the Seebeck coefficient (FIG. 2b) rises considerably, exceeding 200 $\mu VK^{-1}$ at the highest temperatures for the x=1.5 sample. This is consistent with the filling of holes in the valence band as zinc replaces copper. Below room temperature the Seebeck coefficient decreases smoothly toward zero. Above room temperature, with resistivity values in the $10^{-3}$ ohm cm range and Seebeck coefficients ~100-200 $\mu VK^{-1}$, these tetrahedrites have thermoelectric power factors comparable to some of the best thermoelectric materials, like PbTe, in this temperature range.

Turning now to the thermal conductivity, FIG. 3a displays thermal conductivity derived from thermal diffusivity measurements above room temperature. The thermal conductivity is below 1.5 W $m^{-1}$ $K^{-1}$ over the entire temperature range. The thermal conductivity falls monotonically with increasing Zn substitution. This reflects the combined effects of a reduced electronic component of thermal conductivity and a decreasing lattice contribution. If applied, the Wiedemann-Franz law estimates the electronic contribution, extracted is the lattice thermal conductivity of the samples. These results are shown in FIG. 3b. As shown, while the pure sample still has a decreasing lattice thermal conductivity with increasing temperature, the Zn-substituted samples all have lattice thermal conductivity in the range of 0.2-0.5 W $m^{-1}$ $K^{-1}$, and in fact even the pure tetrahedrite sample falls into this range at the highest temperature. This value of lattice thermal conductivity is close to the "minimal" thermal conductivity for a phonon mean free path equal to the interatomic spacing.

The combination of high thermoelectric power factor and low thermal conductivity in these compounds leads to large thermoelectric figure of merit (FIG. 4a). Although the power factor of the x=1.5 sample is less than half that of the x=0 sample, the ZT value at x=1.5 is still higher than that of pure sample, approaching 0.7 at 673K. The maximum ZT value of 0.91 is attained for x=1. The high ZT values are maintained for relatively large Zn substitutions due to the compensating effect from the reduction in thermal conductivity. As can be seen from FIG. 4a, the total thermal conductivity of the x=1.5 sample was reduced to one third of that of pure sample at high temperature. The reduction in total thermal conductivity can be mainly attributed to the decreased electronic thermal conductivity. Because the lattice thermal conductivity in these compounds is so low, reducing the power factor actually leads to a 60% enhancement in ZT value for the case of the x=1 for Zn substitution, due to reduction in electronic thermal conductivity.

Also measured the thermoelectric properties of $Cu_{12-x}Fe_xSb_4S_{13}$ (x=0.2, 0.5, and 0.7). Like their Zn substituted counterparts, the Fe substituted samples display similar trends of an increase in resistivity, enhancement in the Seebeck coefficient and reduction in the total thermal conductivity. The ZT value reaches a maximum value of 0.83 at x=0.5 and decreases for higher values of x. Interestingly, the resistivity of $Cu_{11}FeSb_4S_{13}$ is three orders of magnitude larger than that of $Cu_{12}Sb_4S_{13}$. This difference between Fe and Zn substitution has its origin in the different valence states of Fe and Zn in tetrahedrite, where Fe in synthetic $Cu_{12-x}Fe_xSb_4S_{13}$ is trivalent between for 0<x<1 and divalent for 1≤x≤2. This implies that, in the x range measured here, each Fe atom can provide an extra electron to fill the Brillouin-zone compared to each Zn atom, and explains why Fe substitution causes a larger increase in resistivity for the same x value.

In order to understand the relationship between filling of the Brillouin-zone and the resulting ZT values, the notion of the occupation fraction of the Brillouin-zone: occupation fraction=number of substituting atoms*contributed electrons/2. For example, for x=0.5 Fe substitution, the fraction is 0.5 while for x=0.5 Zn substitution, the fraction is 0.25. FIG. 4b displays the relationship between occupation fraction and the measured ZT values. For both substitutions, the maximum ZT values are reached at 0.5 and ZT begins to diminish for higher occupation fraction. From this plot, ZT values above 0.6 can be attained over a surprisingly large range of Brillouin zone occupation; high ZT is extremely robust against impurity substitution on the copper site in $Cu_{12}Sb_4S_{13}$, with high values maintained up to occupation fraction of 0.8, even if the substitution is a mixture comprising Fe and Zn.

Synthesized single phase and high density Zn and Fe substituted $Cu_{12}Sb_4S_{13}$ provides preferred thermoelectric properties. The intrinsic low lattice thermal conductivities give birth to high ZT values comparable to state of art thermoelectric materials in the range of 600-700 K. The maximum ZT values are 0.91 and 0.83 for Zn and Fe substitutions, respectively. A thermoelectric figure of merit above 0.6 can be maintained over a large range of substitution level, and is related to the occupation fraction of Brillouin-zone. Unlike traditional thermoelectric materials that require careful control over doping level and synthesis conditions, the mineral tetrahedrite can likely be used with little processing effort as an earth-abundant resource for high performance thermoelectricity.

As shown in FIG. 9, $Cu_{12}Sb_4S_{13}$ samples can be synthesized by direct solid state reaction of the starting elements— Cu (99.99%, Alfa-Aesar), Sb (99.9999%, Alfa-Aesar), and S, Zn, Fe (99.999%, Alfa-Aesar). These raw materials were loaded in stoichiometric ratios into quartz ampoules that were evacuated to <$10^{-5}$ Torr. The loaded ampoules were then placed into a vertical furnace and heated at 0.3° C. $min^{-1}$ to 650° C. and held at that temperature for 12 hours. Subsequently, they were slowly cooled to room temperature at the rate of 0.4° C. $min^{-1}$. The resulting reacted material was placed into a stainless vial and ball milled for five minutes in a SPEX sample preparation machine. These ball-milled powders were then cold pressed into a pellet and re-ampouled under vacuum for annealing for two weeks at 450° C. The final product after annealing was ball milled for 30 minutes into fine powders, hot-pressed under argon atmosphere at 80 MPa pressure and 430° C. for 30 minutes, and sliced. All the hot pressed samples used in this study were greater than 98% theoretical density, as measured using the Archimedes method.

If left un-annealed, it has been found that undesirable phases which affect the properties can be formed. In this regard, phases such as $Cu_3SbS_4$ which have high thermocoefficients can be formed. The annealing step is useful in reducing the amounts of secondary and tertiary phases. Grinding and hot pressing increases the density thus improving electrical conductivity an improving handling properties.

XRD analysis was performed by using a Rigaku Miniflex II bench-top X-ray diffractometer (Cu $K_\alpha$ radiation), and the results analyzed using a Jade software package. High temperature (373K-673K) Seebeck coefficient and electrical resistivity were measured in an Ulvac ZEM-3 system under argon. Low temperature Seebeck coefficient and resistivity were measured in a cryostat using four-probe techniques on samples from a different batch than that used for high temperature measurements, but of the same nominal composition. The thermal diffusivity (D) and heat capacity ($C_p$) from 373K to 673K were measured using the laser flash method (Netzsch, LFA 457) and differential scanning calorimetry (Netzsch, DSC200F3) respectively. The data were also confirmed independently in a second laboratory using an Anter Flashline 5000 thermal diffusivity apparatus and a calorimeter. The samples used for these measurements were from adjacent sections of the same pellets as those used for high temperature resistivity and Seebeck coefficient The high temperature thermal conductivity was calculated using $K=D*C_p*density$.

FIG. 2a represents the Electrical resistivity of synthetic tetrahedrite of composition $Cu_{12-x}Zn_xSb_4S_{13}$ above room temperature (circles: x=0; squares: x=0.5; triangles: x=1.0; diamonds: x=1.5). Low temperature resistivity shows that the resistivity decreases strongly with increasing temperature and is consistent with a hopping-type mechanism. At high temperature, the magnitude of the resistivity is in the range typical of good thermoelectric materials. For higher Zn substitution, holes in the valence band are filled and the material becomes insulating for x=2.

Figure 2B:
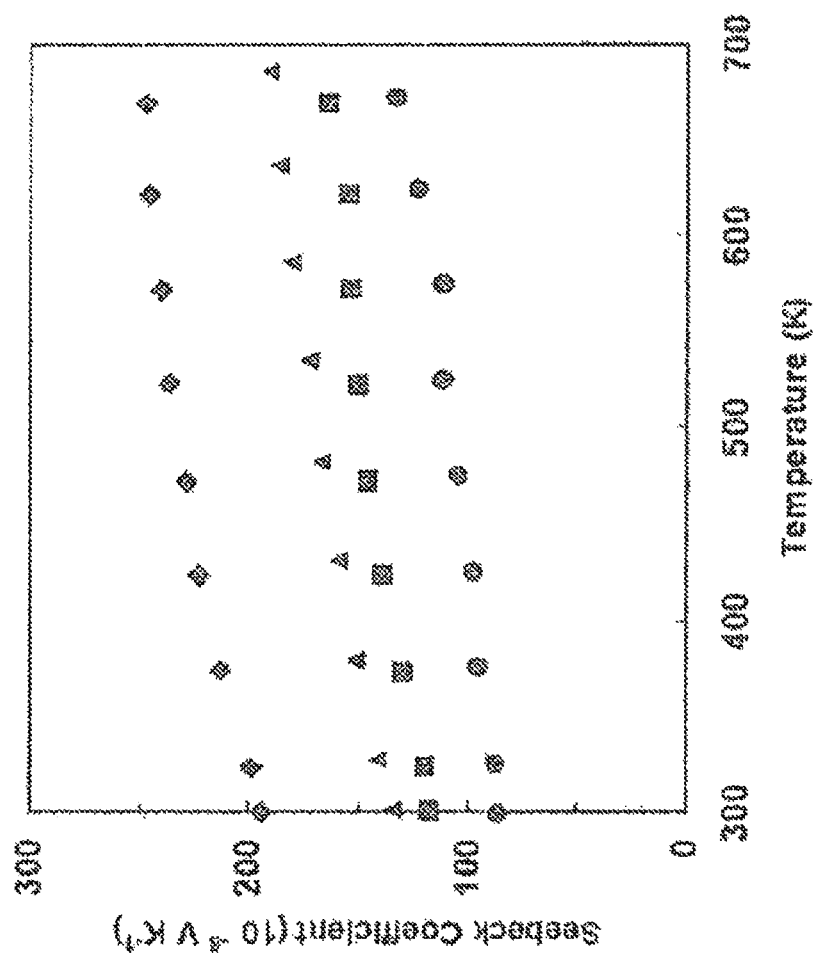

FIG. 2b shows the Seebeck coefficient of tetrahedrite of composition $Cu_{12-x}Zn_xSb_4S_{13}$; sample designation as in FIG. 2a. Seebeck coefficient rise strongly with temperature and Zn content, reaching values in excess of 200 uV $K^{-1}$.

FIG. 3a represents the total thermal conductivities of $Cu_{12-x}Zn_xSb_4S_{13}$, while FIG. 3b represents lattice thermal conductivities of $Cu_{12-x}Zn_xSb_4S_{13}$. The magnitude of the conductivity is comparable to or even smaller than typical thermoelectric materials like lead telluride or skutterudite. Zn-containing samples approach minimal thermal conductivity values over most of the temperature range, as does pure tetrahedrite at the highest measurement temperatures.

FIG. 4a represents Dimensionless thermoelectric figure of merit ZT as a function of temperature for tetrahedrite $Cu_{12-x}Zn_xSb_4S_{13}$. ZT rises with increasing Zn content up to x=1.0, but stays large even for x=1.5. Because the lattice thermal conductivity of these compounds is so small, the electronic thermal conductivity plays a special role in controlling their thermoelectric properties. With increasing Zn content, the resistivity rises, causing the power factor to decrease, but this is more than made up for by a decrease in electronic thermal conductivity.

FIG. 4b represents of merit versus Brillouin zone occupation number for $Cu_{12-x}M_xSb_4S_{13}$ (M=Zn, Fe). ZT reaches a maximum at smaller concentrations for Fe due to its variable valence state.

As seen in FIG. 9, $Cu_{12}(Fe,Zn)_2Sb_4S_{13}$ samples were synthesized by direct reaction of the starting elements—Cu (99.99%, Alfa-Aesar), Sb (99.9999%, Alfa-Aesar), and S, Zn, Fe (99.999%, Alfa-Aesar). The elements were weighted out in stoichiometric proportions using a high-precision Mettler balance; typical charges were on the order of 5 grams total, with individual element masses weighted out with an accuracy of 0.0005 g (0.5 mg). The stoichiometric proportions of the elements were placed into quartz ampoules of inside diameter 10 mm and wall thickness 0.5 mm. The ampoules were evacuated of air using a turbo molecular pump; typical final pressures were $<10^{-5}$ Torr. The ampoules were sealed under dynamic vacuum using an oxygen/methane torch and provided with a small quartz hook on the top. A wire was attached to this hook and the ampoules were suspended in a vertical Thermolyne tube furnace at room temperature. The furnace was heated at 0.3° C. $min^{-1}$ to 650° C. and held at that temperature for 12 hours. Subsequently, the furnace was cooled to room temperature at the rate of 0.4° C. $min^{-1}$.

The reacted material was placed into a stainless vial and ball milled for five minutes in a SPEX sample preparation machine. These ball-milled powders were then cold pressed into a pellet and re-ampouled under vacuum for annealing for two weeks at 450° C. It is envisioned the material can be annealed for less time or at a different temperature. The final product after annealing was ball milled for 30 minutes into fine powders and hot-pressed under argon atmosphere at 80 MPa pressure and 430° C. for 30 minutes. All the hot pressed samples used in this study were greater than 98% theoretical density, as measured using the Archimedes method. It is envisioned hot pressed samples can have a theoretical density of ≥95%. Synthesized two batches each of $Cu_{12-x}Zn_{2-x}Sb_4S_{13}$ and $Cu_{12-x}Fe_{2-x}Sb_4S_{13}$ samples. The high temperature thermoelectric property results presented herein were all gathered from the same pellet for each of the compositions. For some of the low temperature data, different pellets of the same nominal composition were used.

As shown in FIGS. 10 and 11, X-ray diffraction analysis of all of the synthesized specimens was performed by using a Rigaku Miniflex II bench-top X-ray diffractometer (Cu $K_\alpha$ radiation), and the results analyzed using a Jade software package. For each sample a small amount of hot-pressed material was powdered, spread on a microscope slide, and placed in the x-ray beam. FIGS. 5a and 5b show results of x-rays scans on representative $Cu_{12-x}Zn_{2-x}Sb_4S_{13}$ and $Cu_{12-x}Fe_{2-x}Sb_4S_{13}$ samples, respectively. All peaks index to the tetrahedrite phase. Also shown is an x-ray scan gathered from a natural mineral specimen; again the peaks index to the tetrahedrite phase. There is a small shift in the location of the peaks in the natural mineral relative to the synthetic specimens, most likely because the natural mineral contains a mixture of Sb and As on the semimetal site. In this regard, the material according to the present teachings can contain $Cu_{12-x}M_xSb_{4-y}AS_yS_{13}$.

High temperature (373K-673K) Seebeck coefficient and electrical resistivity were measured in an Ulvac ZEM-3 system under argon. Typical specimen sizes for this measurement are 3×3×8 $mm^3$ with measurement performed along the long dimension. The thermal diffusivity (D) and heat capacity ($C_p$) from 373K to 673K were measured using the laser flash method (Netzsch, LFA 457) and differential scanning calorimetry (Netzsch, DSC200F3) respectively. The data were also confirmed independently in a second laboratory using an Anter Flashline 5000 thermal diffusivity apparatus and a calorimeter. Examples of data for thermal diffusivity and heat capacity are shown in FIGS. 6a and 6b. FIGS. 6a and 6b represent a) thermal diffusivity and b) specific heat capacity for synthetic tetrahedrite specimens. Also shown in b) is the Dulong-Petit value for comparison. FIG. 6c depicts low temperature electrical resistivity for a) $Cu_{12-x}Zn_{2-x}Sb_4S_{13}$ (circles: x=0; squares: x=0.5; triangles: x=1.0; diamonds: x=1.5) and b) $Cu_{12-x}Fe_{2-x}Sb_4S_{13}$ (circles: x=0; squares: x=0.2; triangles: x=0.5; diamonds: x=0.7. The samples used for heat capacity and diffusivity measurements were from adjacent sections of the same pellets as those used for high temperature resistivity and Seebeck coefficient The high temperature thermal conductivity was calculated using $K=D*C_p*density$. Density measurements were performed using the Archimedes method with water as the suspending fluid. Low temperature resistivity was measured in a cryostat using four-probe technique on samples from a different batch than that used for high temperature measurements, but of the same nominal composition. The resulting data is shown in FIG. 6c.

FIG. 7 shows a plot of conductivity versus $T^{-1}$, as one might expect for carrier activation, for the Zn-containing samples. The results do not fill well to this model. Rather the data are better-described by a hopping type model. The Fe-containing samples can be described similarly. Low temperature Seebeck coefficients were measured on a series of Zn-containing samples in a flow cryostat using a steady state method. One end of a prism-shaped sample was attached to the cold head of the cryostat, while a small metal film heater/resistor embedded in copper was affixed to the other end. Two copper—constantan thermocouples were attached along the length of the sample to detect the temperature difference dT. The copper legs of the thermocouples were used to measure the Seebeck voltage. Both the high and low temperature Seebeck measurements by also measuring a bismuth telluride Seebeck standard sample (NIST SRM-xxxx), and found differences between measurements and the calibration values of no more than 5% over the range 80-573 K. Low temperature Seebeck measurements for the Zn-containing samples are shown in FIG. 6c. Values near room temperature differ slightly from those shown in FIG. 2c, because the samples measured at low temperature were from a different batch of the same nominal composition. Slight differences in absolute value from sample to sample are expected, because the properties depend on the actual content of Zn.

FIG. 7 represents low temperature electrical conductivity versus inverse temperature for $Cu_{12-x}Zn_{2-x}Sb_4S_{13}$ (circles: x=0; squares: x=0.5; triangles: x=1.0; diamonds: x=1.5). The data are not described well by a simple activation energy. The conductivity is better-described by a hopping model (inset, where conductivity is plotted versus $T^{-1/4}$). Low temperature Seebeck coefficient for $Cu_{12-x}Zn_{2-x}Sb_4S_{13}$ Circles: x=0; squares: x=0.5; triangles: x=1.0; diamonds: x=1.

Compounds of base composition $Cu_{12-x}M_xSb_4S_{13}$ with x=Fe, Zn, or Mn and 0<x<2 are synthesized as described below. Briefly, stoichiometric ratios of the desired elements are melted together in a quartz ampoule under vacuum. The resulting ingot is ground into a powder, pressed into a pellet, and annealed. The pellet can be re-ground into a powder and hot pressed into a pellet of density >98%. Compositions with x=0 have low resistivity ($10^{-3}$ ohm cm at 300 K), modest Seebeck coefficient (75 dV/K at 300 K) and moderately low thermal conductivity (1 W/m/K). Doping with Fe, Zn, or Mn increases both the resistivity and Seebeck coefficient, and substantially lowers the thermal conductivity. Over a wide range of Zn concentration (0<x<2.0 and preferably 0.5<x<1.5) or a wide range of Fe concentration (between 0<x<1.5 and preferably 0.2<x<1.0) the thermoelectric figure of merit remains in the range of 0.6-0.9 at 673 K, similar to or even exceeding that of the best state of the art thermoelectric materials in this temperature range. Importantly, the compositions which exhibit good thermoelectric properties span the range of the widespread natural mineral tetrahedrite compounds $Cu_{12-x}M_x(Sb,As)_4S_{13}$ with M=Ag, Zn, Fe, Mn, or Hg. Optionally, tellurium can be substituted as a percentage of the S, or Cd can be substituted for Cu at certain fractions. This means that these natural minerals may be used directly or with small compositional modification as source materials for thermoelectric devices once processed into a pelletized or film structure.

The current invention is superior because it describes compounds that 1) are made from earth-abundant elements and are themselves common and widespread minerals in the earth crust; 2) consist of elements of light atomic mass, leading to low density and ultimately lower weight devices; 3) require no special processing beyond melting, annealing, and powder processing; 4) exhibit large thermoelectric figure of merit can be maintained over a wide range of composition, simplifying the synthesis procedure; and 5) are of composition that span the range of compositions of the large mineral families of tetrahedrite and tennantite, indicating that these minerals may be used directly as source materials for high efficiency thermoelectrics, leading to considerable cost savings.

FIGS. 12-15 represent material properties for various materials according to the present teachings with 0<x<1.5 (FIGS. 12 and 13) and x=0, 0.2, 0.5, and 0.7 (FIGS. 14 and 15), and FIG. 16 shows Brillouin zone models for tetrahedrite. The potential uses of this teaching are widespread. Thermoelectric devices using this material can be used for converting heat to electricity or electricity to cause a heat gradient. As such, they may be used, for example, to convert waste heat from an automobile engine or other vehicle to useful electrical power. Other potential industry targets include waste heat conversion in power generation (coal- and natural gas-burning power plants), steel production, and in residential/commercial boilers and water heaters. Further, thermoelectric materials are being developed for direct conversion of solar thermal energy to electricity, thereby acting to complement traditional solar cell technology. As shown in FIG. 8, thermoelectric device 98 can have a pair of conductors 100 and a layer of tetrahedrite 102 disposed between the pair of conductors. The layer of tetrahedrite has $Cu_{12-x}M_xSb_4S_{13}$, M is selected from the group of Zn, Fe, and combinations thereof. Alternatively with M being selected from the group consisting of Zn at a concentration 0<x<2.0 (FIGS. 12 and 13) or Fe at a concentration between 0<x<1.5 (FIGS. 14 and 15), or combinations thereof.

The thermoelectric device can have a pair of conductors and a layer of tetrahedrite disposed between the pair of conductors. The layer of tetrahedrite has $Cu_{12-x}M_xSb_{4-y}As_yS_{13}$ where M is selected from the group of Zn at a concentration 0<x<2.0, Fe at a concentration 0<x<1.5, and combinations thereof. The device can use a sintered tetrahedrite comprising $Cu_{12-x}M_xSb_{4-y}AS_yS_{13}$ wherein M is selected from the group of Zn at a concentration 0<x<2.0, Fe at a concentration 0<x<1.5, and combinations thereof.

To produce the thermoelectric device, material comprising $Cu_{12-x}M_xSb_4S_{13}$ wherein M is selected from the group of Zn at a concentration 0<x<2.0, Fe at a concentration 0<x<1.5, and combinations thereof is sintered to form a tetrahedrite microstructure. The sintered material is ground using a mill, and hot pressed, to a density of greater than 95% to form a pellet. The pellet is placed between a pair of electrical conductors.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

The invention claimed is:

1. A thermoelectric composition comprising $Cu_{12-x}M_xSb_{4-y}As_yS_{13}$, where M is Zn and $0<x<2$, Fe and $0<x<1.5$, or a combination thereof, and $0 \leq y<4$.

2. The thermoelectric composition according to claim 1, wherein the composition comprises $Cu_{12-x}M_xSb_4S_{13}$.

3. The thermoelectric composition according to claim 1, wherein M is Zn and Fe.

4. The thermoelectric composition according to claim 1, wherein M is Zn and $0<x<2.0$.

5. The thermoelectric composition according to claim 1, wherein M is Fe and $0<x<1.5$.

6. A method of producing a thermoelectric composition comprising $Cu_{12-x}M_xSb_4S_{13}$ where M is Zn and $0<x<2$, Fe and $0<x<1.5$, or a combination thereof, the method comprising:
    preparing a stoichiometric mixture of Cu, Sb, S and at least one of Zn and Fe;
    heating the mixture to a temperature of 650° C.;
    cooling the mixture at a rate of 0.4° C./min;
    ball milling the mixture to form a powder; and
    hot pressing the powder to form a pellet comprising the thermoelectric composition.

7. The method according to claim 6, wherein the pellet has a density of greater than 95%.

8. A thermoelectric composition comprising $Cu_{12-x}M_xSb_4S_{13}$, where M is Zn at a concentration of $0<x<1.5$, at a concentration of $0.2<x<1$, or a combination thereof.

* * * * *